US008994422B2

(12) United States Patent
Yao et al.

(10) Patent No.: US 8,994,422 B2
(45) Date of Patent: Mar. 31, 2015

(54) USE OF FREQUENCY ADDITION IN A PLL CONTROL LOOP

(71) Applicant: ESS Technology, Inc., Fremont, CA (US)

(72) Inventors: Hu Jing Yao, Kelowna (CA); Dustin Dale Forman, Kelowna (CA); A. Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 14/055,772

(22) Filed: Oct. 16, 2013

(65) Prior Publication Data

US 2014/0103977 A1    Apr. 17, 2014

Related U.S. Application Data

(60) Provisional application No. 61/715,252, filed on Oct. 17, 2012.

(51) Int. Cl.
*H03L 7/06* (2006.01)
*H03L 7/195* (2006.01)
*H03L 7/18* (2006.01)
*H03L 7/23* (2006.01)

(52) U.S. Cl.
CPC ....... *H03L 7/195* (2013.01); *H03L 7/18* (2013.01); *H03L 7/235* (2013.01)

USPC ............................................ 327/159; 327/150

(58) Field of Classification Search
None
See application file for complete search history.

(56) References Cited

U.S. PATENT DOCUMENTS

| 6,115,586 | A  | * | 9/2000  | Bezzam et al. | ............... | 455/112 |
|-----------|----|---|---------|---------------|------------------|---------|
| 7,978,012 | B2 | * | 7/2011  | Wood          | ............... | 331/2   |
| 8,054,114 | B2 | * | 11/2011 | Kuo           | ............... | 327/156 |
| 2007/0002013 | A1 | * | 1/2007 | Kong et al.   | ............... | 345/157 |
| 2011/0116587 | A1 | * | 5/2011 | Ryu et al.    | ............... | 375/376 |

* cited by examiner

*Primary Examiner* — Cassandra Cox
(74) *Attorney, Agent, or Firm* — Gard & Kaslow LLP

(57) ABSTRACT

A method and system is disclosed in which the phase detector in a phase-locked loop is able to run at the fastest speed appropriate for a reference signal. A frequency offset is added to the output frequency of the phase-locked loop, to alter the frequency fed to the frequency divider which would receive the output frequency in a conventional PLL to an intermediate frequency. The frequency offset is selected so that the ratio of the intermediate frequency to the reference frequency is a simple fraction, and preferably an integer, i.e., the intermediate frequency is a multiple of the reference frequency. In cases where the relationship between the output frequency and the reference frequency is largely relatively prime, the phase detector is thus able to receive signals at the frequency of the reference signal and operate at the fastest speed appropriate for the reference signal.

15 Claims, 5 Drawing Sheets

USE OF FREQUENCY ADDITION IN A PLL CONTROL LOOP

This application claims priority from Provisional Application No. 61/715,252, filed Oct. 17, 2012, which is incorporated b reference herein in its entirety.

FIELD OF THE INVENTION

The present invention relates generally to control loops, and more particularly to a phase-locked loop (PLL).

BACKGROUND OF THE INVENTION

A phase-locked loop, commonly referred to as a PLL, is a control loop that generates an output signal whose phase is related to the phase of an input, or reference, signal. A PLL typically has a local oscillator with a variable frequency and a phase detector. The local oscillator generates a periodic signal; the phase detector compares the phase of that signal with the phase of a reference input periodic signal and adjusts the oscillator to keep the phases matched. The output signal is brought back for comparison with the input signal in a feedback loop.

Keeping the phases of the input and output signals in lockstep also implies keeping the frequencies of the input and output signals the same, or in a fixed relationship. Thus, in addition to synchronizing the signals, in a PLL the output frequency can track the input frequency or it can be a frequency that is a multiple of the input frequency.

These properties allow PLLs to be widely used in such applications as radio, telecommunications, computers, and others. PLLs can be used to demodulate a signal, recover a signal from a noisy communications channel, generate a stable frequency that is a multiple of an input frequency (frequency synthesis), or synchronize clocks and distribute precisely timed pulses in digital logic circuits such as microprocessors. Since a building block containing a complete PLL may be easily inserted in an integrated circuit, such techniques are widely used in modern electronic devices, with output frequencies from a fraction of hertz (Hz) up to many gigahertz (GHz).

One way of obtaining a local oscillator signal, and thus an output signal, that is proportional to the input signal is well known in the art. Digital dividers are inserted in the reference path and/or the feedback path of the PLL, and their relationship determines the relative frequencies of the signals.

In such a known method, the frequency of an input reference signal $F_{REF}$ is divided, by an integer N, by the use of a digital divider, to create a signal at a frequency $F_{REF}/N$. Similarly, the output frequency $F_{LO}$ of the local oscillator is divided by an integer M to create a signal at a frequency $F_{LO}/M$.

These two frequencies are fed to the phase detector, which is constructed to adjust the frequency of the local oscillator such that:

$$\frac{F_{REF}}{N} = \frac{F_{LO}}{M}$$

which means that the frequency of the local oscillator is given by:

$$F_{LO} = F_{REF} \frac{M}{N}$$

Consequently, such a PLL can generate any frequency relative to the input reference frequency that is defined by the ratio of two integers M/N.

A typical prior art PLL using this principle is shown in FIG. 1. PLL 100 contains a local oscillator 102, a phase detector 104, digital dividers 106 and 108, and a filter 110. An input signal having a frequency of FRET is applied to a digital divider 108 and the frequency $F_{REF}$ is divided by an integer N. The resulting frequency $F_{REF}/N$ is then applied to the phase detector 104. This drives the local oscillator 102 (which is often a voltage controlled oscillator) to a frequency $F_{LO}$, which is the output frequency. The signal from the local oscillator is also fed back through the other digital divider 106 where its frequency is divided by M, so that phase detector 104 also receives the frequency $F_{LO}/M$. The phase detector causes the relationship between $F_{LO}$ and $F_{REF}$ to be as described above, and results in the value of $F_{lo}$ in the equation above.

Filter 110 is located between phase detector 104 and local oscillator 102, and is typically a filter of a second order or higher. One of skill in the art of PLLs will appreciate that many variations on filter 110 are known and may provide benefits such as noise reduction, stability, etc.

It will be apparent to those of skill in the art that in such a PLL the most efficient operation takes place when N=1. This allows signals to arrive at the phase detector at the fastest rate possible for a particular input signal (i.e., the same frequency as the input signal since $F_{REF}/1=F_{REF}$), which allows for phase detector "events" (i.e., comparisons) and thus adjustments to the local oscillator to occur at the same rate, minimizing the time between adjustments during which differences may accumulate in the phase of the local oscillator compared to the input signal. However, this situation is not common, since if N=1 the value of $F_{LO}$ is limited to integral multiples of $F_{REF}$.

It is also known in the art of PLL design that the need to find values of M and N which convert both $F_{LO}$ and $F_{REF}$ to a common frequency to apply to the phase detector causes a problem to arise when M and N are large numbers that have no common factors (M and N are said to be "largely relatively prime" in this case). Consider the situation if a frequency is desired of 500/91 times 27 megahertz (MHz), something often required in multimedia chips. Using a traditional PLL as in FIG. 1 above, M=500 and N=91, with an input frequency of 27 MHz. The values of M and N cannot be made any smaller since the two integers 500 and 91 have no common factors.

Signals will thus arrive at the phase detector at a rate of $F_{ref}/91$, i.e., 27 MHz÷91, or about 296 KHZ. At this frequency the local oscillator will run for about 1/296 KHz, or about 3.4 microseconds (µS), before the phase can be adjusted. During this period between adjustments, differences may begin to accumulate in the phase of the signal from the local oscillator as compared to the input signal, and the system may exhibit a higher than desirable phase noise.

The generally accepted means to avoid low frequency signals being applied to the phase detector in such cases where M and N are largely relatively prime is known as the "variable modulus pre-scalar" solution. In such a solution, N is made to approximate a large value by spending various amounts of time at two other values on either side of N. For example, in the case above where M/N is desired to be 500/91, Ni may instead be set to 50 and the value of N changed so that the average value of N will be 9.1. Thus, N will be 9 for nine operations in a row, and then 10 for a single operation, so that the sequence of values of N will be 9,9,9,9,9,9,9,9,9,10. In this case the average value of N is in fact 9.1, and the PLL will, on average, settle down into a pattern where the frequency of $F_{lo}$ is 50/9.1, i.e., 500/91, times the frequency of $F_{REF}$, as required.

The variable modulus pre-scalar is thus a viable solution in the sense that it may reduce phase noise by reducing the time between phase detector events, but it also suffers from a problem in that there is "dither" between the two values of N that are used to obtain the desired average value. The systematic error in the value of N will show up as "side tones," i.e., spurious responses in the spectrum of the local oscillator and thus an output signal that includes frequencies other than the desired output frequency. Various techniques may be used to control this, for example "noise shaping" of the dither, but none of these techniques approach the more ideal case where N=1.

It is thus desirable to find a solution for the situation where the desired frequency requires a ratio that is largely relatively prime but which avoids the use of a variable modulus pre-scalar while preserving the ability to generate any arbitrarily accurate local oscillator frequency.

SUMMARY OF THE INVENTION

A method and system is disclosed for adding a frequency offset to the output frequency of a phase-locked loop so that the phase detector in the loop can compare signals having a ratio that is not largely relatively prime, thus causing the phase detector to receive signals closer to the frequency of the reference signal and operate at a faster rate.

One embodiment discloses a phase-locked loop for locking a phase of an output signal to a reference signal, the output signal having a frequency that is different from a frequency of the reference signal, comprising: an oscillator configured to generate the output signal at a desired frequency and to adjust the phase of the output signal based upon a phase difference signal; a frequency offset module configured to: determine an offset frequency signal which, when added to the output signal, results in a signal having a frequency which is an integral multiple M times the frequency of the reference signal, and add the offset frequency signal to the output signal to create an intermediate signal; a frequency divider configured to frequency-divide the intermediate signal by the integer M; and a phase detector configured to receive the frequency-divided intermediate signal and the reference signal, compare the phase of the frequency-divided intermediate signal with the phase of the reference signal, and output a phase difference signal to the oscillator based upon the comparison.

Another embodiment discloses a method of locking a phase of an output signal to a reference signal, the output signal having a frequency that is different from a frequency of the reference signal, comprising: generating the output signal at a desired frequency; determining an offset frequency signal which, when added to the output signal, will result in a signal having a frequency which is an integral multiple M times the frequency of the reference signal; adding the offset frequency signal to the output signal to create an intermediate signal; dividing the frequency of the intermediate signal by the integer M; comparing the phase of the divided intermediate signal to the phase of the reference signal; and adjusting the phase of the output signal to correspond to the phase of the reference signal based upon the comparison of the phase of the divided intermediate signal to the phase of the reference signal.

Another embodiment discloses a non-transitory computer readable storage medium having embodied thereon instructions for causing a computing device to execute a method of locking a phase of an output signal to a reference signal, the output signal having a frequency that is different from a frequency of the reference signal, the method comprising: generating the output signal at a desired frequency; determining an offset frequency signal which, when added to the output signal, will result in a signal having a frequency which is an integral multiple M times the frequency of the reference signal; adding the offset frequency signal to the output signal to create an intermediate signal; dividing the frequency of the intermediate signal by the integer M; comparing the phase of the divided intermediate signal to the phase of the reference signal; and adjusting the phase of the output signal to correspond to the phase of the reference signal based upon the comparison of the phase of the divided intermediate signal to the phase of the reference signal.

DETAILED DESCRIPTION OF THE INVENTION

Described herein is a system and method for adding a frequency offset to the output frequency of a phase-locked loop so that the phase detector in the loop can compare signals having a ratio that is not largely relatively prime, and thus that the phase detector can receive signals closer to the frequency of the reference signal and operate at a faster rate.

The frequency offset is used to alter the frequency fed to the frequency divider which would receive the output frequency in a conventional PLL to an intermediate frequency, and is selected so that the ratio of the intermediate frequency to the reference frequency is a simple fraction, and preferably an integer, i.e., the intermediate frequency is a multiple of the reference frequency. In cases where the relationship between the output frequency and the reference frequency is largely relatively prime, the phase detector is thus able to receive signals at the frequency of the reference signal and operate at the fastest speed appropriate for the reference signal.

Figure 2:
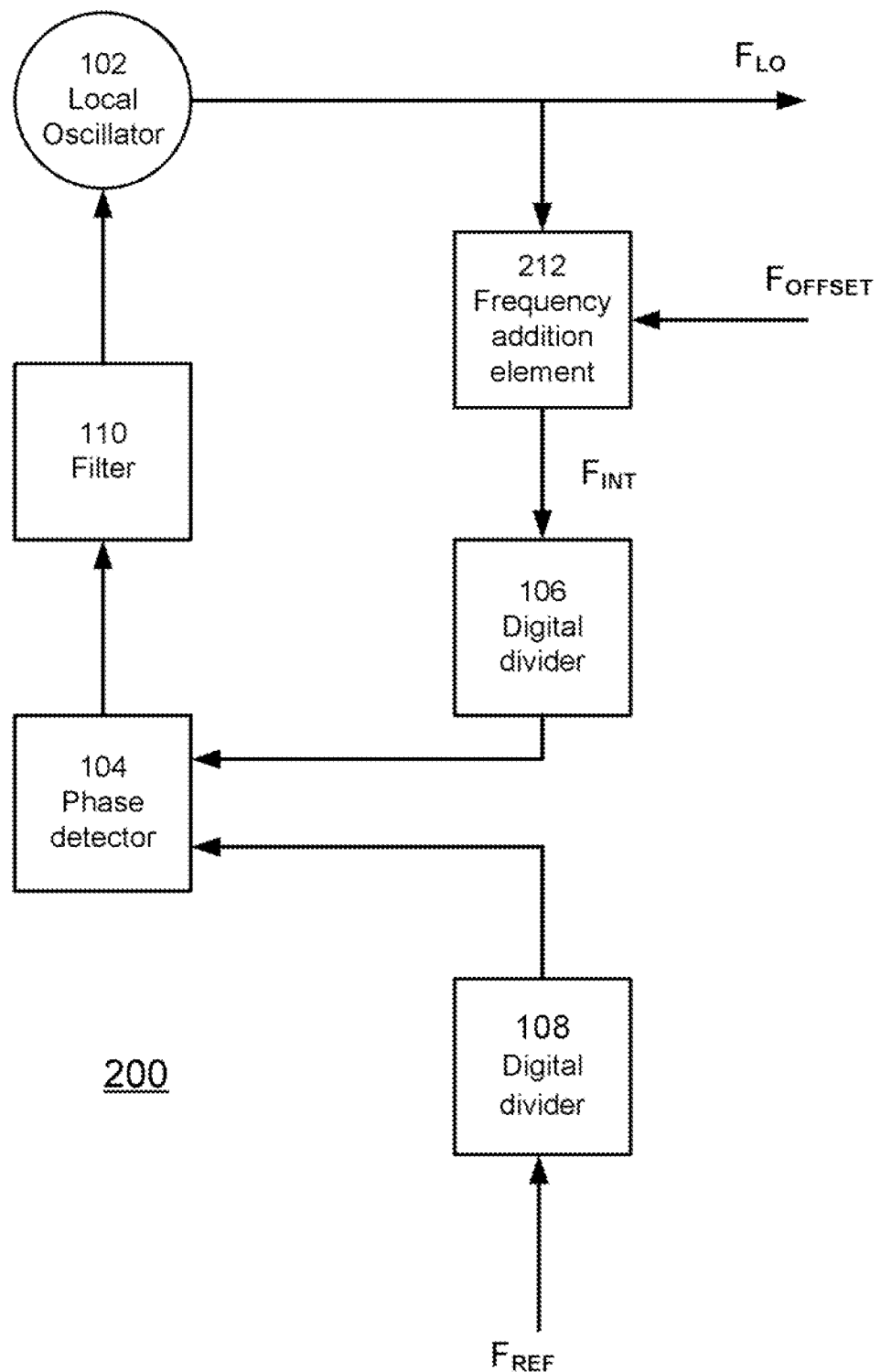
FIG. 2 is a block diagram of an improved phase-locked loop (PLL) according to one embodiment.

FIG. 2 shows one embodiment of an improved PLL 200 in which the frequency $F_{LO}$ can be adjusted to arrive at an intermediate frequency $F_{INT}$, and $F_{INT}$ is applied to phase detector 104 instead of $F_{LO}$. $F_{INT}$ is selected such that the resulting relationship of $F_{INT}$ to $F_{REF}$ does not require the values of M to N to be largely relatively prime, which in turn means that the phase detector 104 can operate at shorter intervals.

Figure 1:
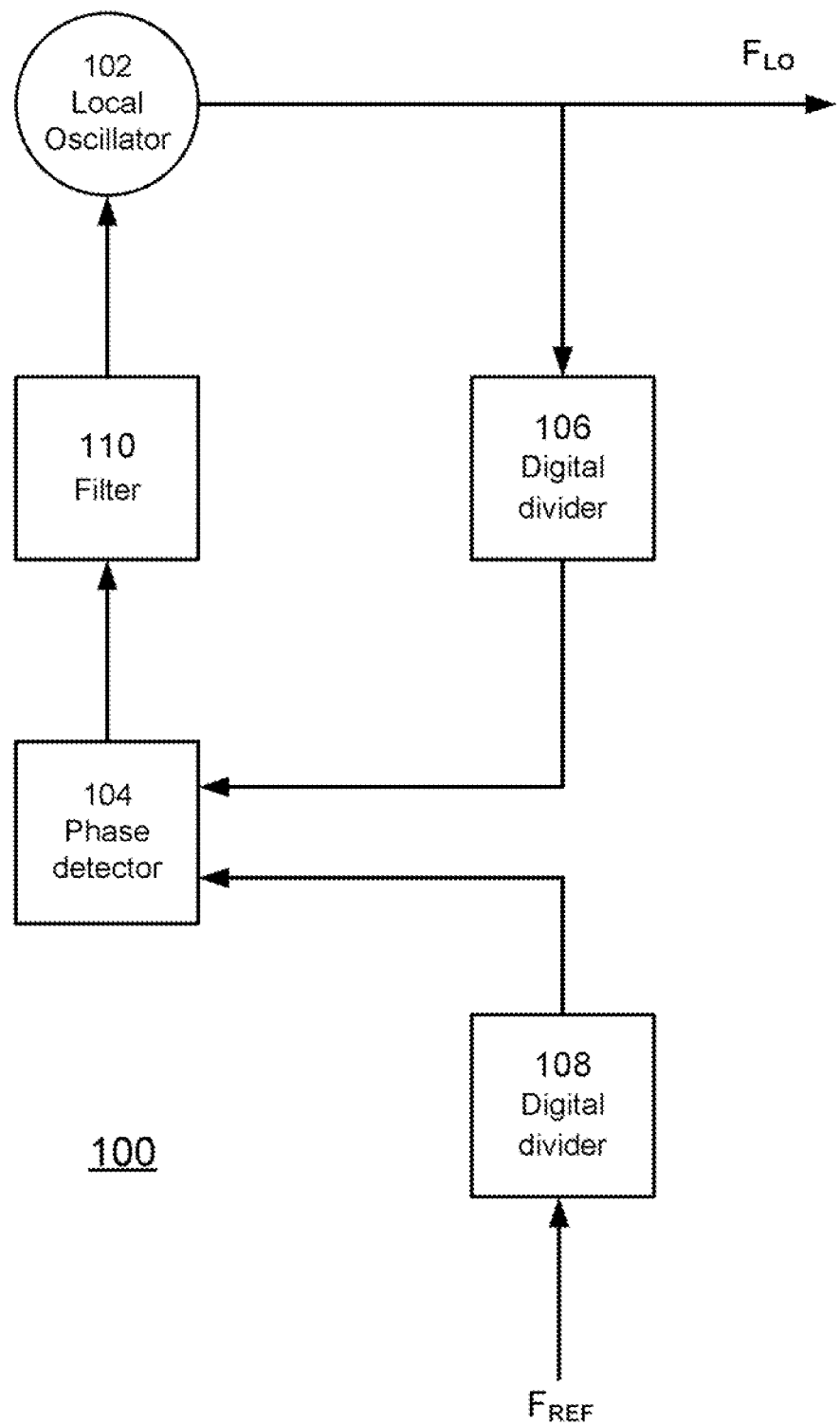
FIG. 1 is a block diagram of a typical prior art phase-locked loop (PLL).

To accomplish this, a new frequency addition element 212 is added to the circuit of FIG. 1; the remaining components are as in FIG. 1. Frequency addition element 212 adds an adjustment frequency $F_{OFFSET}$ to $F_{LO}$ to create the frequency $F_{INT}$, and it is $F_{INT}$ that is divided by M and the result fed to phase detector 104. The loop now operates such that:

$$F_{INT} = F_{REF} \frac{M}{N}$$

Since $F_{INT}=F_{LO}+F_{OFFSET}$ to, this results in:

$$F_{LO} = F_{REF} \frac{M}{N} - F_{OFFSET}$$

where $F_{OFFSET}$ may be a positive or negative frequency offset.

Consider the case where $F_{REF}$ is 10 MHz, and $F_{LO}$ is desired to be 304.3 MHz. In the PLL 100 of FIG. 1 the values of M and N would thus need be M=3043 and N=100 (since M and N again must be integers). The phase detector 104 would thus receive a signal at the rate of $F_{REF}$/N, or 10 MHz/100=100 KHz.

Instead, however, in one embodiment $F_{OFFSET}$ may be set to −4.3 MHz. As above, $F_{INT}=F_{LO}+F_{OFFSET}$, or 304.3 MHz minus 4.3 MHz, i.e., 300 MHz. Now M and N may be set such that M=30 and N=1, and phase detector 104 will receive a signal at the same 10 MHz rate as $F_{REF}$. $F_{LO}$ will remain at the desired value of 304.3 MHz.

By setting the value of $F_{OFFSET}$, and thus $F_{INT}$, appropriately, it should always be possible to allow the value of N to be 1 and thus for the phase detector 104 to operate at the rate of $F_{REF}$, resulting in improved performance over the prior art. Those of skill in the art will appreciate how known techniques such as simple dividers may be used to generate the signal needed by the frequency addition element 212 to generate the adjustment frequency $F_{OFFSET}$. Alternatively, the offset frequency may be provided from an external source or any frequency generation means known in the art.

Those of skill in the art will also appreciate that the value of N need not be 1 to obtain a significant benefit from the described apparatus and method. In some cases, it may be easier or more desirable for some reason to have N be 2, or some other integer value which results in a ratio of M to N which is not largely relatively prime. Any ratio of M to N which is not largely relatively prime will result in an increase in the frequency of the signals received by phase detector 104, and thus an improvement in performance of the PLL.

Frequency addition element 212 is the element that adds or subtracts an offset frequency $F_{OFFSET}$ from the local oscillator frequency $F_{LO}$. From a mathematical perspective, frequency addition element 212 has two inputs, $F_{LO}$ and $F_{OFFSET}$, which it adds together to generate an output $F_{INT}$ which is applied to digital divider 106 in FIG. 2.

One way in which frequency addition element 212 may be implemented is now described. Consider three signals A, B and C, each operating at a given frequency $\omega_0$, each being sinusoidal and each being 120 degrees (i.e., ⅔ of π) out of phase with the others. These three signals may thus be represented by the equations:

$$A = \sin(\omega_0 * t)$$
$$B = \sin\left(\omega_0 * t + \frac{2}{3}\pi\right)$$
$$C = \sin\left(\omega_0 * t + \frac{4}{3}\pi\right)$$

Note that since all three signals are at the same frequency, any of them may be considered "the output signal."

Now consider a second set of signals X, Y and Z, which are at a different frequency $\omega_1$, but bear the same 120 degree relationship to each other, such that:

$$X = \sin(\omega_1 * t)$$
$$Y = \sin\left(\omega_1 * t + \frac{2}{3}\pi\right)$$
$$Z = \sin\left(\omega_1 * t + \frac{4}{3}\pi\right)$$

If these are used to form the sum of products:

$$P = A*X + B*Y + C*Z$$

it can be shown by trigonometric identities that this means:

$$P = \frac{3}{2}\cos(\omega_0 - \omega_1)$$

which is a pure sinusoid, i.e., having only one frequency component, at the frequency $\omega_0 - \omega_1$.

Note that this has resulted in a frequency subtraction, so that P is the difference of the two radian frequencies. If X, Y and Z are defined slightly differently, such that:

$$X = \sin(\omega_1 * t)$$
$$Y = \sin\left(\omega_1 * t - \frac{2}{3}\pi\right)$$
$$Z = \sin\left(\omega_1 * t - \frac{4}{3}\pi\right)$$

then P would be the sum of the frequencies, i.e.:

$$P = \frac{3}{2}\cos(\omega_0 + \omega_1)$$

Thus, positive and negative frequencies can be represented by the relative phase of the three signals such as X, Y and Z.

In this example, A, B and C (and X, Y and Z) are conveniently the three phases of a three-stage local oscillator, which is commonly known in the art, and which may be used as local oscillator 102 in the PLLs 100 and 200 of FIGS. 1 and 2 respectively. Such a three-stage local oscillator essentially creates the three signals directly as voltages on the three stages. The signals A, B and C are typically relatively fast signals, in the range 100's of MHz. The signals X, Y and Z, which are used as the offsetting frequency, are typically a lower frequency, for example in the 10's of MHz.

The signals X, Y and Z are preferably defined as digital signals into a multiplying digital-to-analog converter (DAC), which is possible without much difficulty given their relatively low frequency. The multiplying DACs are connected to add their outputs to make the final signal $F_{OFFSET}$ which is sent to digital divider 106 in FIG. 2.

Figure 3:
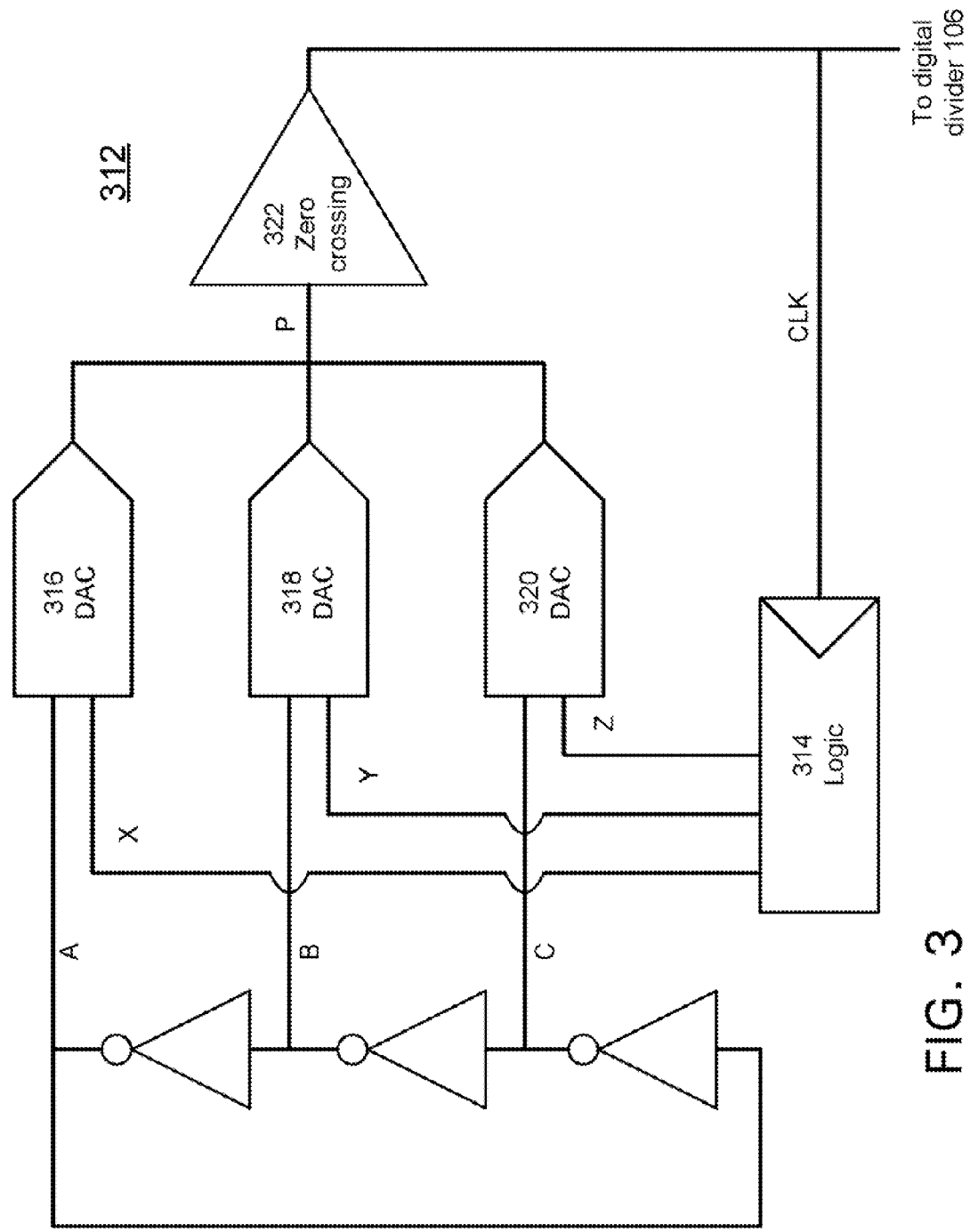
FIG. 3 is a block diagram of a frequency addition element according to one embodiment.

FIG. 3 shows a frequency addition element 312 that operates in the fashion described above according to one embodiment, and which may be used as frequency addition element 212 in FIG. 2 above. The three signals A, B and C are analog signals that come from the three elements of a three-phase local oscillator. One of skill in the art will appreciate how to construct such a local oscillator such that the operating frequency and bandwidth of the local oscillator will result in substantially sinusoidal signals, and that, because there are three elements in the operating loop, each signal will have a relative phase of 120 degrees to the other signals.

The three signals X, Y and Z are digital signals representative of a three-phase sinusoidal quantity and are created by a logic block 314. Three multiplying DACs 316, 318 and 320 each produce an output which is the product of the respective analog input quantity A, B or C and the digital input quantity X. Y or Z. Thus, DAC 316 creates the product of A and X, DAC 318 creates the product of B and Y, and DAC 320 creates the product of C and Z.

The three products A times X, B times Y, and C times Z are then added together and produce a sinusoidal output signal P as in the equations above. P is fed to a zero-crossing detector 322, which produces an output the value of which is either 0 or 1, and which changes from one value to the other when the input signal crosses zero. Zero-crossing detector 322 thus produces a digital output signal, i.e., a signal having only the values of 0 or 1 rather than a sinusoidal signal.

Frequency addition element 312 is self-docking as shown. The output of the zero-crossing detector 322 is used as the clock for logic block 314 and thus advances (or retards) the three-phase sinusoidal quantity represented by the three-phase digital signals X, Y and Z. This in turn, causes the phase of P, the sinusoidal output of DACs 316, 318 and 320, to advance or retard relative to the phase of the local oscillator. As a result of such feedback, each zero crossing of the signal P changes the phase of P, and P is thus not at the same frequency as the local oscillator.

For example, suppose that logic block 314 is constructed such that on every clock cycle it advances the phase of the signals X, Y and Z by 10 degrees. This will result in X, Y and Z making a complete cycle every 36 clock signals. Suppose further that the local oscillator is operating at 100 MHz, so that it makes a dock cycle every 10 nanoseconds (nS), in each cycle of the local oscillator, signals A, B and C will also complete one cycle and will thus be at the same frequency.

However, in each cycle of the local oscillator, the signal P will not complete one cycle, but rather will complete one cycle plus 10 degrees, and is thus at a slightly higher frequency than the 100 MHz of the local oscillator. It will be apparent that with a 10 degree change for every cycle of the local oscillator, after 36 cycles of the local oscillator the signal P will have instead completed 37 cycles. Thus, P has a frequency that is 37/36 times faster than that of the local oscillator, so that if the local oscillator is at 100 MHz, F will instead be at a frequency of 102.778 MHz. The output of the zero-crossing detector 322 provides the input to digital divider 106.

Frequency addition element 312 is not limited to the embodiment illustrated in FIG. 3. While three phases of signals A, B and C, and X, Y and Z, are shown, any number of phases greater than 1 may be used. Logic block 314 may advance the phase of X, Y and Z, and thus P, by any desired amount.

Figure 5:
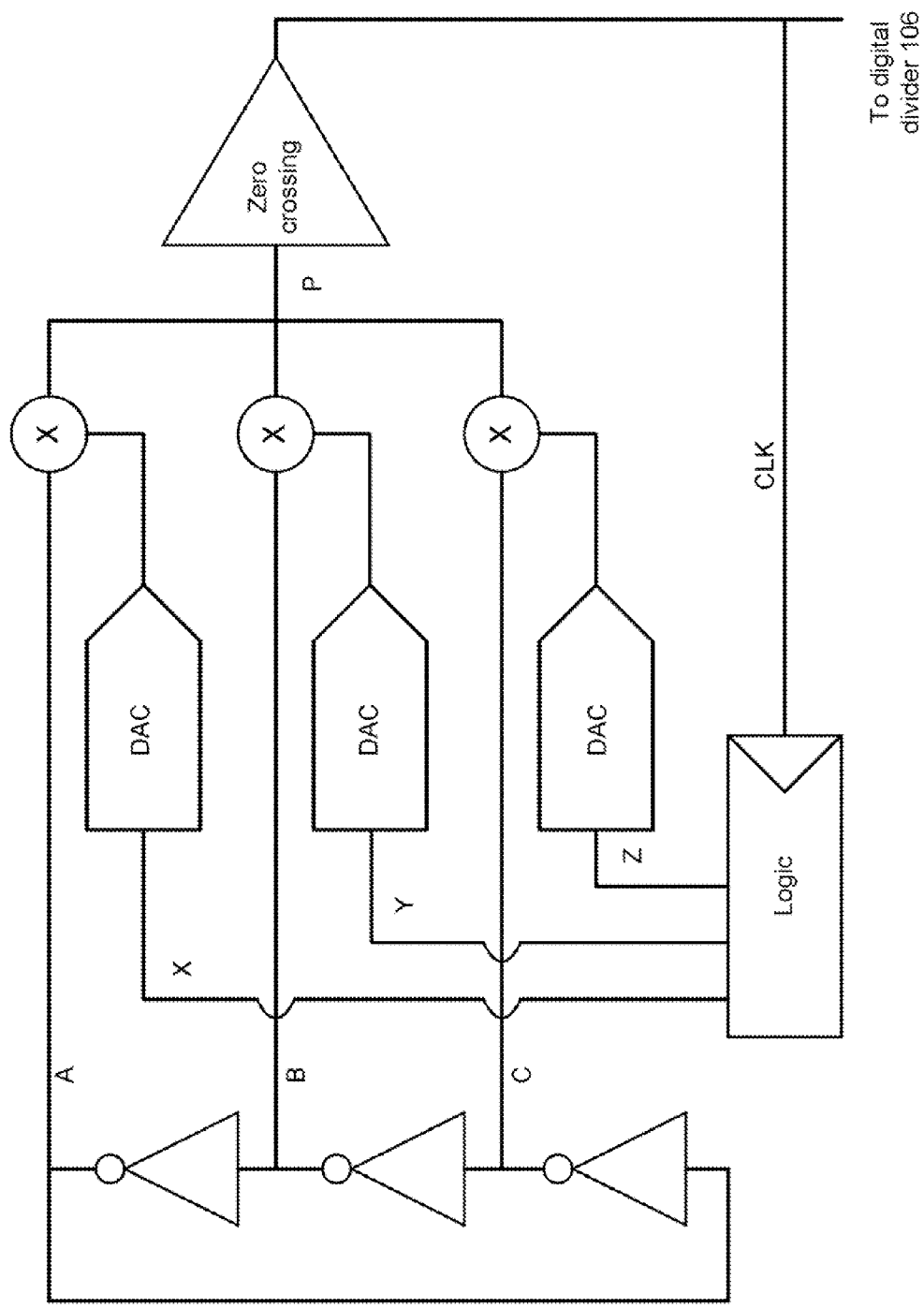
FIG. 5 is a block diagram of a frequency addition element according to another embodiment.

Further, one of skill in the art will appreciate other ways of constructing frequency addition element 312. For example, it is possible to use conventional, non-multiplying DACs and have each DAC output drive an analog multiplier which receives as its other input the corresponding signal from the local oscillator, and to add the outputs of the multipliers together by any convenient means, as illustrated in FIG. 5. Finally, DACs need not be used at all, but rather may be replaced by another analog multi-phase signal generator such as is used as the local oscillator. In such a case, the analog outputs of both multi-phase signal generators will go to analog multipliers configured to make the frequency sum (or difference), and the resulting frequency will go to a zero-crossing detector which then drives a digital divider as described above.

Figure 4:
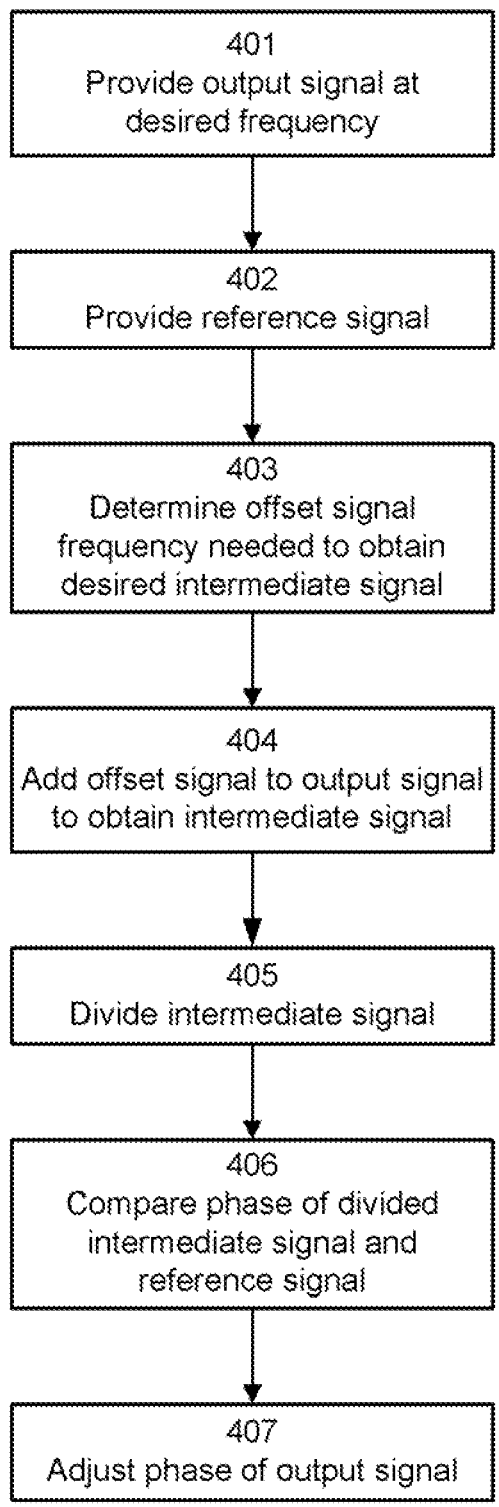
FIG. 4 is a flowchart illustrating one embodiment of a method for adding an offset frequency in a PLL.

FIG. 4 is a flowchart illustrating one embodiment of a method for adding an offset frequency in a PLL. At step 401, an output signal at a desired output frequency is provided, for example by a local oscillator as shown in FIG. 2. At step 402, a reference signal to which the phase of the output signal is to be compared is provided, the reference signal having a reference frequency.

As above, the relationship of the output signal frequency to the reference signal frequency will be in some ratio M/N, where M and N are integers. At step 403 an offset frequency is determined such that an intermediate frequency which is the sum of the output frequency and the offset frequency is an integral multiple of the reference frequency, i.e., that there is a different ratio M/N between the intermediate frequency and the reference frequency, and the ratio M/N may be reduced to the ratio M'/1, where M' is again an integer. The offset frequency may, for example, be created by a circuit such as frequency addition element 312 of FIG. 3. At step 404 the offset signal is added to the output signal to create an intermediate signal at the intermediate frequency.

At step 405, the intermediate signal is divided by the integer M', and at step 406 the phase of the resulting signal is compared to the phase of the reference signal. An example of this may be seen in FIG. 2, in which the intermediate frequency $F_{INT}$ is divided by digital divider 106, and the result, along with the reference signal $F_{REF}$, is fed to phase detector 104.

At step 407, the phase of the output signal is adjusted to correspond to the phase of the reference signal based upon the result of the comparison of the phased of the intermediate signal and the reference signal. Again, in practice, this can be done based upon a signal sent to the local oscillator 102 from the phase detector 104 indicating whether any adjustment in the phase of the output signal is necessary.

As above, one of skill in the art will appreciate that different types of local oscillators, and different ways of generating the offset frequency may be used. Also, it is not strictly necessary that the reference signal frequency not be divided, i.e., that N=1, although as above this will result in the fastest signal being applied to the phase detector and thus the smallest time allowed between phase corrections at the local oscillator in which phase differences may arise. Finally, some or all of the steps described may be performed by, or under the control of, a computer or processor running as program which implements or controls such steps. A processor may, for example, be used to generate the offset frequency.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

It should also be appreciated that the described method and apparatus can, be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc. It may be possible to incorporate the described methods into hard-wired logic if desired. It should be noted that the order of the steps of the methods described herein may be altered, and still be within the scope of the disclosure.

These and other variations upon the embodiments are intended to be covered by the present disclosure, which is limited only by the appended claims.

What is claimed is:

1. A phase-locked loop for locking a phase of an output signal to a reference signal, the output signal having a frequency that is different from a frequency of the reference signal, comprising:
   an oscillator configured to generate a plurality of analog signals at a selected frequency, each of the plurality of analog signals having a different phase such that the phases of the plurality of analog signals are distributed equally across a cycle of the frequency of the output signal, and to adjust the phase of the output signal based upon a phase difference signal;
   a frequency offset module comprising:
      a logic block for producing a plurality of digital signals at an offset frequency which, when added to the output signal, results in a signal having a frequency which is an integer multiple M times the frequency of the reference signal, the number of digital signals equal to the number of analog signals in the plurality of analog signals generated by the oscillator, each digital signal representative of a sinusoidal quantity and having the same frequency as the other digital signals but a different phase from the other digital signals such that the phases of the plurality of digital signals are equally spaced over a cycle of the sinusoidal quantity;
      a plurality of multiplying digital-to-analog converters, each digital-to-analog converter receiving a different one of the plurality of analog signals and a different one of the plurality of digital signals and outputting the product of the received signals, the outputs of the digital-to-analog converters connected to produce a summed signal; and
      a zero-crossing detector which receives the summed signal and produces an output as an intermediate signal which has a value of either 0 or 1 and changes from one value to the other when the summed signal crosses zero;
   a frequency divider configured to frequency-divide the intermediate signal by the integer M; and
   a phase detector configured to receive the frequency-divided intermediate signal and the reference signal, compare the phase of the frequency-divided intermediate signal with the phase of the reference signal, and output the phase difference signal to the oscillator based upon the comparison.

2. The phase-locked loop of claim 1 further comprising a filter between the phase detector and the oscillator.

3. The phase-locked loop of claim 1 wherein the oscillator is a voltage controlled oscillator.

4. The phase-locked loop of claim 1 further comprising a second oscillator configured to generate an offset frequency signal and output the offset frequency signal to the logic block, and wherein the logic block produces the plurality of digital signals at the offset frequency using the offset frequency signal.

5. The phase-locked loop of claim 1 further comprising the zero-crossing detector outputting the intermediate signal to the logic block, and wherein the logic block clocks itself with the intermediate signal.

6. The phase-locked loop of claim 2 wherein the filter between the phase detector and the oscillator is a filter of a second or higher order.

7. A method of locking a phase of an output signal to a reference signal, the output signal having a frequency that is different from a frequency of the reference signal, comprising:
   generating, by an oscillator, the output signal at a selected frequency;
   determining an offset frequency signal which, when added to the output signal, will result in a signal having a frequency which is an integral multiple M times the frequency of the reference signal;
   generating the offset frequency signal and adding the offset frequency signal to the output signal to create an intermediate signal by:
      producing a plurality of digital signals in a logic block, the number of digital signals equal to the number of analog signals in the plurality of analog signals generated by the oscillator, each digital signal representative of a sinusoidal quantity and having the same frequency as the other digital signals but a different phase from the other digital signals such that the phases of the plurality of digital signals are equally spaced over a cycle of the sinusoidal quantity;
      multiplying, by a plurality of digital-to-analog converters, each of the plurality of analog signals by a different one of the plurality of digital signals and outputting the products of the multiplied signals, the outputs of the digital-to-analog converters connected to produce a summed signal;
      receiving the summed signal in a zero-crossing detector which produces an output as the intermediate signal which has a value of either 0 or 1 and changes from one value to the other when the summed signal crosses zero;
   dividing, with a frequency divider, the frequency of the intermediate signal by the integer M;
   comparing, with a phase detector, the phase of the divided intermediate signal to the phase of the reference signal; and
   adjusting, by the oscillator, the phase of the output signal to correspond to the phase of the reference signal based upon the comparison of the phase of the divided intermediate signal to the phase of the reference signal.

8. The method of claim 7 further comprising generating, by a second oscillator, a signal at the offset frequency as an input to the logic block, and wherein the logic block produces the plurality of digital signals at the offset frequency using the offset frequency signal.

9. The method of claim 7 further comprising the zero-crossing detector outputting the intermediate signal to the logic block, and wherein the logic block clocks itself with the intermediate signal.

10. A non-transitory computer readable storage medium having embodied thereon instructions for locking a phase of an output signal to a reference signal, the output signal having a frequency that is different from a frequency of the reference signal, the method comprising:
   generating, by an oscillator, the output signal at a selected frequency;
   determining an offset frequency signal which, when added to the output signal, will result in a signal having a frequency which is an integral multiple M times the frequency of the reference signal;

generating the offset frequency signal and adding the offset frequency signal to the output signal to create an intermediate signal by:

producing a plurality of digital signals in a logic block, the number of digital signals equal to the number of analog signals in the plurality of analog signals generated by the oscillator, each digital signal representative of a sinusoidal quantity and having the same frequency as the other digital signals but a different phase from the other digital signals such that the phases of the plurality of digital signals are equally spaced over a cycle of the sinusoidal quantity;

multiplying with a plurality of digital-to-analog converters, each of the plurality of analog signals by a different one of the plurality of digital signals and outputting the products of the multiplied signals, the outputs of the digital-to-analog converters connected to produce a summed signal; and receiving the summed signal in a zero-crossing detector which produces an output as the intermediate signal which has a value of either 0 or 1 and changes from one value to the other when the summed signal crosses zero;

dividing, with a frequency divider, the frequency of the intermediate signal by the integer M;

comparing, with a phase detector, the phase of the divided intermediate signal to the phase of the reference signal; and adjusting, by the oscillator, the phase of the output signal to correspond to the phase of the reference signal based upon the comparison of the phase of the divided intermediate signal to the phase of the reference signal.

11. A phase-locked loop for locking a phase of an output signal to a reference signal, the output signal having a frequency that is different from a frequency of the reference signal, comprising:

an oscillator configured to generate a plurality of analog signals at a selected frequency, each of the plurality of analog signals having a different phase such that the phases of the plurality of analog signals are distributed equally across a cycle of the frequency of the output signal, and to adjust the phase of the output signal based upon a phase difference signal;

a frequency offset module comprising:

a logic block for producing a plurality of digital signals at an offset frequency which, when added to the output signal, results in a signal having a frequency which is an integer multiple M times the frequency of the reference signal, the number of digital signals equal to the number of analog signals in the plurality of analog signals generated by the oscillator, each digital signal representative of a sinusoidal quantity and having the same frequency as the other digital signals but a different phase from the other digital signals such that the phases of the plurality of digital signals are equally spaced over a cycle of the sinusoidal quantity;

a plurality of digital-to-analog converters, each digital-to-analog converter receiving a different one of the plurality of digital signals and outputting an analog signal corresponding to the received digital signal;

a plurality of multipliers, each multiplier receiving a different one of the outputs of the digital-to-analog converters and a different one of the plurality of analog signals, and outputting the product of the received signals, the outputs of the digital-to-analog converters connected to produce a summed signal; and a zero-crossing detector which receives the summed signal and produces an output as an intermediate signal which has a value of either 0 or 1 and changes from one value to the other when the summed signal crosses zero;

a frequency divider configured to frequency-divide the intermediate signal by the integer M; and a phase detector configured to receive the frequency-divided intermediate signal and the reference signal, compare the phase of the frequency-divided intermediate signal with the phase of the reference signal, and output the phase difference signal to the oscillator based upon the comparison.

12. The phase-locked loop of claim 11 further comprising a filter between the phase detector and the oscillator.

13. The phase-locked loop of claim 12 wherein the filter between the phase detector and the oscillator is a filter of a second or higher order.

14. The phase-locked loop of claim 11 further comprising the zero-crossing detector outputting the intermediate signal to the logic block, and wherein the logic block clocks itself with the intermediate signal.

15. The phase-locked loop of claim 11 further comprising a second oscillator configured to generate an offset frequency signal and output the offset frequency signal to the logic block, and wherein the logic block produces the plurality of digital signals at the offset frequency using the offset frequency signal.

* * * * *